US012325931B2

(12) United States Patent
McClure et al.

(10) Patent No.: US 12,325,931 B2
(45) Date of Patent: Jun. 10, 2025

(54) NITROGEN-ENABLED HIGH GROWTH RATES IN HYDRIDE VAPOR PHASE EPITAXY

(71) Applicants: Alliance for Sustainable Energy, LLC, Golden, CO (US); Rochester Institute of Technology, Rochester, NY (US)

(72) Inventors: Elisabeth Lynne McClure, Lakewood, CO (US); Kevin Louis Schulte, Denver, CO (US); Aaron Joseph Ptak, Littleton, CO (US); John David Simon, Austin, TX (US); Wondwosen Tilahun Metaferia, Aurora, CO (US)

(73) Assignees: Alliance for Sustainable Energy, LLC, Golden, CO (US); Rochester Institute of Technology, Rochester, NY (US)

( * ) Notice: Subject to any disclaimer, the term of this patent is extended or adjusted under 35 U.S.C. 154(b) by 0 days.

(21) Appl. No.: 16/900,905

(22) Filed: Jun. 13, 2020

(65) Prior Publication Data
US 2020/0407873 A1 Dec. 31, 2020

Related U.S. Application Data

(60) Provisional application No. 63/011,732, filed on Apr. 17, 2020, provisional application No. 62/860,893, filed on Jun. 13, 2019.

(51) Int. Cl.
| | |
|---|---|
| *H01L 21/02* | (2006.01) |
| *C30B 25/08* | (2006.01) |
| *C30B 25/14* | (2006.01) |
| *C30B 25/16* | (2006.01) |
| *C30B 29/42* | (2006.01) |

(52) U.S. Cl.
CPC .............. *C30B 25/08* (2013.01); *C30B 25/14* (2013.01); *C30B 25/16* (2013.01); *C30B 29/42* (2013.01); *H01L 21/0262* (2013.01)

(58) Field of Classification Search
CPC ......... C30B 25/08; C30B 23/06; C30B 29/42; H01L 21/0262; H01L 21/02546
See application file for complete search history.

(56) References Cited

U.S. PATENT DOCUMENTS

| | | | |
|---|---|---|---|
| 4,253,887 | A | 3/1981 | Jolly |
| 4,368,098 | A | 1/1983 | Manasevit |
| 4,419,179 | A | 12/1983 | Nogami |

(Continued)

FOREIGN PATENT DOCUMENTS

EP   0037199 A1   10/1981

OTHER PUBLICATIONS

Beaudet, A., "How do I read the solar panel specifications?", Apr. 13, 2016, retrieved online from https://www.altestore.com/blog/2016/04/how-do-i-read-specifications-of-my-solar-panel/#XNbupCJKhhE on May 10, 2019, 6 pages.

(Continued)

*Primary Examiner* — Jaehwan Oh
(74) *Attorney, Agent, or Firm* — Neal S. Vickery; Sam J. Barkley

(57) ABSTRACT

Disclosed herein are methods and devices that use a low-thermal conductivity inert gas to shield reactant gases and thus enabling a cold wall operation within a hot wall system.

11 Claims, 7 Drawing Sheets

(56) References Cited

U.S. PATENT DOCUMENTS

| | | | |
|---|---|---|---|
| 4,488,914 A | 12/1984 | Quinlan et al. | |
| 4,710,428 A | 12/1987 | Tamamizu et al. | |
| 5,330,046 A | 7/1994 | Yuzawa et al. | |
| 5,685,214 A | 11/1997 | Neff et al. | |
| 7,272,333 B2 | 9/2007 | Mizes | |
| 7,727,333 B1* | 6/2010 | Syrkin | C30B 29/403 117/89 |
| 8,647,435 B1 | 2/2014 | Dmitriev et al. | |
| 8,987,156 B2* | 3/2015 | D'Evelyn | C30B 29/403 501/96.4 |
| 8,992,684 B1 | 3/2015 | Kovalenkov et al. | |
| 9,416,464 B1 | 8/2016 | Dmitriev et al. | |
| 9,647,156 B1* | 5/2017 | Tassev | H01L 31/035236 |
| 9,650,723 B1* | 5/2017 | D'Evelyn | C30B 9/00 |
| 9,824,890 B2 | 11/2017 | Young et al. | |
| RE47,114 E* | 11/2018 | D'Evelyn | C30B 7/105 |
| 10,192,740 B2 | 1/2019 | Young et al. | |
| 10,903,389 B2* | 1/2021 | Schulte | C30B 29/42 |
| 2002/0155713 A1 | 10/2002 | Tsvetkov et al. | |
| 2002/0170484 A1* | 11/2002 | Katamine | C30B 29/40 117/4 |
| 2003/0008765 A1 | 1/2003 | Niwa et al. | |
| 2004/0047714 A1 | 3/2004 | Poli et al. | |
| 2004/0137657 A1 | 7/2004 | Dmitriev et al. | |
| 2004/0178251 A1 | 9/2004 | Trucco | |
| 2005/0142391 A1 | 6/2005 | Dmitriev et al. | |
| 2005/0167899 A1 | 8/2005 | Aldridge et al. | |
| 2006/0011135 A1 | 1/2006 | Dmitriev et al. | |
| 2006/0285945 A1 | 12/2006 | Hofmeister et al. | |
| 2007/0032046 A1* | 2/2007 | Dmitriev | H01L 21/02378 438/478 |
| 2007/0138505 A1* | 6/2007 | Preble | H01L 21/02505 257/190 |
| 2009/0127662 A1 | 5/2009 | Okahisa et al. | |
| 2009/0130781 A1 | 5/2009 | Dmitriev et al. | |
| 2009/0149008 A1 | 6/2009 | Kryliouk et al. | |
| 2009/0178611 A1 | 7/2009 | Arena et al. | |
| 2010/0024732 A1 | 2/2010 | Mokhlesi et al. | |
| 2010/0164070 A1 | 7/2010 | Okahisa et al. | |
| 2010/0273320 A1 | 10/2010 | Kappeler et al. | |
| 2010/0279020 A1 | 11/2010 | Melnik et al. | |
| 2011/0155049 A1* | 6/2011 | Solomon | C30B 25/10 118/733 |
| 2011/0259879 A1 | 10/2011 | Hanawa et al. | |
| 2011/0297076 A1 | 12/2011 | Lee et al. | |
| 2012/0058630 A1* | 3/2012 | Quinn | C23C 16/4412 427/255.39 |
| 2012/0132638 A1 | 5/2012 | Garcia et al. | |
| 2012/0269226 A1 | 10/2012 | Parks et al. | |
| 2013/0309848 A1* | 11/2013 | Young | H01L 21/02631 118/719 |
| 2014/0196660 A1 | 7/2014 | Fujikura et al. | |
| 2015/0235848 A1 | 8/2015 | Schunemann et al. | |
| 2015/0325430 A1 | 11/2015 | Young et al. | |
| 2015/0380496 A1* | 12/2015 | Ishibashi | H01L 21/02609 257/615 |
| 2016/0268129 A1 | 9/2016 | Mori et al. | |
| 2017/0204533 A1 | 7/2017 | Schumann et al. | |
| 2017/0260628 A1* | 9/2017 | Fujikura | C30B 25/14 |
| 2017/0260630 A1 | 9/2017 | Fujikura et al. | |
| 2018/0330927 A1 | 11/2018 | Bera et al. | |
| 2018/0354803 A1 | 12/2018 | Liu et al. | |
| 2019/0221705 A1* | 7/2019 | Schulte | C30B 25/14 |
| 2020/0385886 A1* | 12/2020 | Hoteida | C30B 23/066 |
| 2021/0143297 A1* | 5/2021 | Schulte | C23C 16/54 |

OTHER PUBLICATIONS

Castaldini, A. et al., "The EL2 trap in highly doped GaAs:Te," Journal of Applied Physics, vol. 78, No. 11, Dec. 1995, 6 pages.
DenBaars, S.P. et al., "Homogeneous and Heterogeneous Thermal Decomposition Rates of Trimethylgallium and Arsine and Their Relevance to the Growth of GaAs by MOCVD," Journal of Crystal Growth, vol. 77, 1986, 6 pages.
Deschler, M. et al., "Very Rapid Growth of High Quality GaAs, InP and Related III-V Compounds," Journal De Physique, Colloque C4, vol. 49, Sep. 1988, pp. C4-689-C4692.
Enstrom, R. et al., "Influence of gas phase stoichiometry on the properties of vapour-grown In1-xGaxP alloys," Proceedings of the 1972 Symposium on GaAs (Institute of Physics, London, 1973), vol. 17, pp. 37-47.
Fan, J. et al., "Simplified fabrication of GaAs homojunction solar cells with increased conversion efficiencies," Applied Physics Letters, vol. 36, Issue 6, Mar. 15, 1978, pp. 390-392.
Grüter, K. et al., "Deposition of High Quality GaAs Films at Fast Rates in the LP-CVD System," 1989, Journal of Crystal Growth, vol. 94, pp. 607-612.
King, R. et al., "Advances in High-Efficiency III-V Multijunction Solar Cells," Advances in OptoElectronics, vol. 2007, Article ID 29523, Accepted Sep. 2007, 8 pages.
Koukitu, A. et al., "Thermodynamic Analysis of the Vapour Growth of GaAs: The Inert Gas-Hydrogen Mixed Carrier System," Japanese Journal of Applied Physics, vol. 16, No. 11, 1977, 5 pages.
Ourdudoss, S. et al., "Hydride Vapor Phase Epitaxy Revisited," IEEE Journal of Selected Topics in Quantum Electronics, vol. 3, No. 3, Jun. 1997, pp. 749-767.
Metaferia, W. et al., "Gallium arsenide solar cells grown at rates exceeding 300 um h-1 by hydride vapor phase epitaxy," Nature Communications, doi.org/10.1038/s41467-019-11341-3, 2019, 8 pages.
Mountziaris, T. et al., "Gas-Phase and Surface Reaction Mechanisms in MOCVD of GaAs with Trimethyl-Gallium and Arsine," Journal of Electrochemical Society, vol. 138, No. 8, 1991, 15 pages.
Olsen, G.H., "Vapour-phase Epitaxy of GaInAsP," GaInAsP Alloy Semiconductors, Edited by T. P. Pearsall, 1982 John Wiley & Sons, Ltd., Chapter 1, pp. 11-25.
Sato, M. et al., "Effect of precracking of organometallics and arsine on growth of GaAs," Journal of Crystal Growth, vol. 115, 1991, 5 pages.
Schulte, K. et al., "Controlled formation of GaAs pn junctions during hydride vapor phase expitaxy of GaAs," Journal of Crystal Growth, vol. 352, Issue 1, Aug. 2012, pp. 253-257.
Schulte, K. et al., "A Kinetic Model for GaAs Growth by Hydride Vapor Phase Epitaxy," 2016 IEEE Photovoltaics Specialists Conference, pp. 1930-1933.
Schulte, K. et al., "Computational fluid dynamics-aided analysis of a hydride vapor phase epitaxy reactor," Journal of Crystal Growth, vol. 434, 2016, 10 pages.
Schulte, K. et al., "High growth rate hydride vapor phase epitaxy at low temperature through use of uncracked hydrides," Applied Physics Letters, vol. 112, 2018, 5 pages.
Schulte, K. et al., "Multijunction Ga0.5In0.5P/GaAs solar cells grown by dynamic hydride vapor phase epitaxy," Progress in Photovoltaics, vol. 26, 2018, 7 pages.
Schwetlick, S. et al., "Growth Mechanisms in GaAs-VPE at Low Deposition Temperature," Crystal Research Technology, vol. 20, No. 4, 1985, 7 pages.
Shahrjerdi, D. et al., "High-efficiency thin-film InGaP/InGaAs/Ge tandem solar cells enabled by controlled spalling technology," Applied Physics Letters, vol. 100, 2012, pp. 053901-1 through 053901-3.
Shaw, Don, "Influence of Substrate Temperature on GaAs Epitaxial Deposition Rates," 1968, Journal of the Electrochemical Society, vol. 115, No. 4, pp. 405-408.
Simon, J. et al., "III-V-Based Optoelectronics with Low-Cost Dynamic Hydride Vapor Phase Epitaxy," Crystals, vol. 9, No. 3, 2019, 14 pages.
Wikipedia, "Solar cell efficiency," Jul. 22, 2017, retrieved online from https://en.wikipedia.org/w/index.php?title=solar_cell_efficiency&oldid=791811865, 7 pages.
Yao-Wang, L. et al., "Epitaxial Growth of High Purity GaAs in an Argon Atmosphere," Journal of Crystal Growth, vol. 70, 1984, pp. 108-111.
PCT/17-39 Search Report and Written Opinion dated Jul. 23, 2019; 4 pages.

(56) References Cited

OTHER PUBLICATIONS

European Extended Search Report from corresponding European Patent Application No. 19738729.3 dated Sep. 14, 2021, 6 pages.
International Search Report and Written Opinion from corresponding PCT patent application No. PCT/US20/37640, mail date Oct. 5, 2020, 7 pages.
International Search Report and Written Opinion from related PCT patent application No. PCT/US20/37806, mail date Oct. 5, 2020, 12 pages.
Corresponding European Extended Search Report, European Patent Application No. 20822484.0, mail date May 25, 2023, 8 pages.

\* cited by examiner

NITROGEN-ENABLED HIGH GROWTH RATES IN HYDRIDE VAPOR PHASE EPITAXY

CROSS-REFERENCE TO RELATED APPLICATIONS

This application claims priority under 35 U.S.C. § 119 to U.S. Provisional Patent Application Nos. 62/860,893, filed on 13 Jun. 2019 and 63/011732 filed on 17 Apr. 2020, the contents of which are hereby incorporated by reference in their entirety.

CONTRACTUAL ORIGIN

The United States Government has rights in this invention under Contract No. DE-AC36-08GO28308 between the United States Department of Energy and Alliance for Sustainable Energy, LLC, the Manager and Operator of the National Renewable Energy Laboratory.

BACKGROUND

Hydrogen is a traditional carrier gas used in organometallic vapor phase epitaxy and hydride vapor phase epitaxy (HVPE) tools for growth of As/P semiconductors. Dynamic-hydride vapor phase epitaxy (D-HVPE) has attracted significant attention for its high growth rates of III-V materials exceeding 300 μm/h while maintaining excellent material quality. D-HVPE is capable of growing structures with abrupt and defect-free heterointerfaces as demonstrated by the growth of Esaki diodes and multijunction solar cells. D-HVPE's ability to transfer samples quickly between multiple growth chambers enables the high-quality heterointerfaces required for these devices. In addition to excellent performance, D-HVPE has the potential to be a low-cost III-V growth technique due to the use of elemental group III precursors, high utilization of metals and hydrides, and ultrafast growth rates that would enable high throughput in production-line reactors.

An additional strategy to decrease the cost associated with HVPE is to consider alternative carrier gases other than $H_2$ carrier gas, which is the typical carrier gas used for III-V As/P growth. HVPE growth has been demonstrated with inert carrier gases such as $N_2$ or Ar, which is advantageous because $H_2$ is both highly flammable and comparatively more expensive. However, HVPE growth historically exhibited lower growth rates when conducted with an inert carrier gas instead of $H_2$ in a regime where arsenic vapor ($As_2$ or $As_4$) is the dominant group V species, which would negatively affect throughput in production-line reactors.

SUMMARY

In an aspect, disclosed herein are methods and devices for increasing the epitaxial growth rate on a reaction surface within a HVPE reactor. In an embodiment, the method uses a low-conductivity inert carrier gas to deliver a reactant to the reaction surface. In another embodiment, the reactant is $AsH_3$. In another embodiment, the temperature at the reaction surface is about 700° C. lower when compared to using hydrogen as a carrier gas. In an embodiment, the concentration of $AsH_3$ or another reactant at the reaction surface is greater than when using hydrogen as a carrier gas.

In an aspect, disclosed herein is a reactor capable of the deposition of at least one layer of a semiconductor device by using hydride vapor phase epitaxy (HVPE) using at least one group III metal source, at least one group V hydride gas, and an inert carrier gas, wherein the reactor comprises at least one source zone region at a temperature of up to about 800° C., and at least one deposition zone region at a temperature of below about 700° C.; and a delivery means to the deposition zone region wherein the delivery means comprises the inert gas carrier and reactant gases comprising a group III metal and at least one group V hydride gas that are flowed towards a growth substrate at a volumetric flow rate. In an embodiment, the reactor has a deposition zone region that is below about 650° C. In an embodiment, the at least one layer of the semiconductor device is GaAs. In an embodiment, the GaAs deposition is up to 528 μm/h. In another embodiment, the rate of deposition of the at least one layer of a semiconductor device is improved by up to 32 percent when compared to using $H_2$ as a carrier gas in the reactor instead of the inert carrier gas. In an embodiment, the volumetric flow rate for the inert carrier gas and group V hydride gas is up to 5000 sccm. In an embodiment, the volumetric flow rate for the group V hydride gas is up to 100 sccm. In yet another embodiment, the partial pressure for the group V hydride gas within the inert gas carrier and reactant gases is up to 0.01 atm. In an embodiment, the partial pressure for the gas comprising the group III metal within the inert gas carrier and reactant gases is up to 0.0012 atm.

In an aspect, disclosed herein is a method for growing at least one layer of a semiconductor device using a reactor comprising at least one source zone and at least one deposition zone wherein the method comprises hydride vapor phase epitaxy (HVPE) using at least one group III metal, at least one group V hydride gas, and an inert carrier gas. In an embodiment, the at least one source zone is at a temperature of up to about 800° C., and wherein the at least one deposition zone is at a temperature of up to about 700° C. In another embodiment, the at least one layer of the semiconductor device is GaAs. In an embodiment, the GaAs growth rate is up to 528 μm/h. In an embodiment, the growth rate of the at least one layer of a semiconductor device is improved by up to 32 percent when compared to using $H_2$ as a carrier gas in the reactor instead of the inert gas. In another embodiment, a volumetric flow rate of the inert carrier gas and group V hydride gas is up to 5000 sccm. In an embodiment, a volumetric flow rate for the group V hydride gas is up to 100 sccm. In an embodiment, a partial pressure for the group V hydride gas within the inert carrier gas is up to 0.01 atm. In yet another embodiment, a surface roughness of the GaAs layer is below 0.8 nm. In an embodiment, an electron mobility of the GaAs layer is up to 1600 $cm^2$/V-s. In an embodiment, an electron concentration of the GaAs layer is up to $9.9 \times 10^{18}$ $cm^{-3}$.

DESCRIPTION OF THE DRAWINGS

Exemplary embodiments are illustrated in referenced figures of the drawings. It is intended that the embodiments and figures disclosed herein are to be considered illustrative rather than limiting.

FIG. 1 depicts the mole fraction of $As_4$ within an HVPE reactor when using hydrogen versus when using a low-thermal conductivity inert gas.

FIG. 2 depicts the mole fraction of $AsH_3$ within a portion of a HVPE reactor when using hydrogen versus when using a low-thermal conductivity inert gas. As depicted in FIG. 2, the concentration of AsH$_3$ at a reaction surface in the HVPE reactor using a low-thermal conductivity inert gas is significantly higher than the same reactor using hydrogen.

FIG. 7a depicts CFD modeling of As$_4$ partial pressure inside the growth chamber where more As$_4$ is generated with H$_2$ carrier gas. FIG. 7b depicts AsH$_3$ partial pressure inside the growth chamber showing that more AsH$_3$ is delivered to the substrate with N$_2$. FIG. 7c depicts a cross-sectional view of the plane of the substrate, showing the partial pressure of each species at the substrate position.

DETAILED DESCRIPTION

Figure 1:
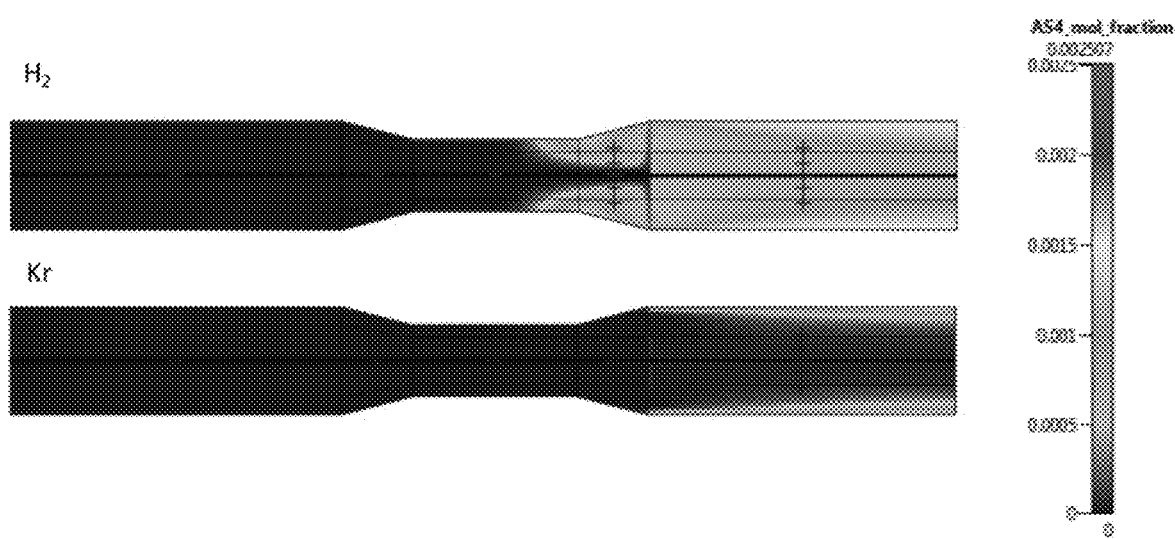
FIG. 1 depicts an embodiment of a portion of an HVPE reactor that uses a low-thermal conductivity inert gas.

Disclosed herein are methods that use nitrogen as a carrier gas in HVPE. By using nitrogen as a carrier gas in HVPE, record fast growth rates reaching 432 microns/hour (about 40% faster than the current record using hydrogen as a carrier gas) have been observed.

The two largest cost barriers for III-V photovoltaics are those of both the growth and the substrate. Therefore, enhancing the growth rate of III-V semiconductors would increase the throughput of these devices, which decreases the total costs associated with growth with a simple modification to reactant gases. Additionally, use of a nitrogen ambient is potentially necessary to enable the nucleation and growth of GaAs epilayers on a monolayer-graphene coated GaAs substrate, because H$_2$ is known to etch graphene at typical reactor temperatures. "Remote-epitaxy" through graphene and liftoff is a technology that is useful as a route to reduce substrate costs.

In an embodiment, disclosed herein are record GaAs growth rates approaching 530 μm/h using nitrogen carrier gas and 400 μm/h using hydrogen carrier gas in a dynamic-hydride vapor phase epitaxy reactor. Computational fluid dynamics modeling was performed to study the effect that either nitrogen or hydrogen carrier gas has on heat and mass transfer given the potential AsH$_3$ decomposition at surfaces. As disclosed herein through experiments and support with modeling, nitrogen carrier gas enhances the growth rate compared to hydrogen carrier gas in a hydride-enhanced regime by minimizing the amount of arsine that decomposes before reaching the wafer surface.

Previous work using HVPE has demonstrated that using nitrogen as a carrier gas in HVPE slows the growth rate of III-V semiconductors. However, as disclosed herein, experiments using a dynamic-HVPE tool have resulted in a growth rate increase from 20%-100% when using nitrogen as a carrier gas instead of hydrogen, which indicates an exciting discovery contrary to conventional wisdom. Without being limited by theory, a "hydride-enhanced" growth mechanism does not require H$_2$ to participate in the reaction, and H$_2$ is potentially a product of the reaction AsH$_3$+GaCl→GaAs+H$_2$+HCl. This means that there are potential advantages to using an inert and/or higher density carrier gas, which thus makes the use of N$_2$ enabling. A final advantage is that a nitrogen environment is non-flammable, which increases the safety of this growth technique compared to growth in a hydrogen ambient.

Previously, others in the art have stated that since argon and nitrogen are gases with heavier atomic weight, that the growth rate would be lower than that of hydrogen at the same temperature. However, as disclosed herein, the heavier gas can also affect the density and potentially thin the boundary layer thickness to enhance the growth rate. Without being limited by theory, hydrogen may be both a carrier gas and reactant that participates in the reaction to enhance the growth rate. Hydrogen may play a role in both the forward and reverse reactions.

Without being bound by theory, since the partial pressure of GaCl increases in nitrogen at the expense of HCl, solid GaAs tends to vaporize into the gas phase with the increase of the mole fraction of nitrogen and hence a reduction in growth rate is observed. However, the effect of partial pressure may be offset by the reduction in boundary layer thickness or difference in thermal conductivity between hydrogen and nitrogen.

Disclosed herein are methods and devices that use a low-thermal conductivity inert gas to shield the reactant gases and hence create a regime of cold wall operation within a hot wall system. In contrast to using a low thermal conductivity carrier gas that lowers the temperature of all of the reactant species, using methods and devices disclosed herein protects the stream of hot gases from the temperature of the reactor walls.

In another embodiment, disclosed herein is a method for the insulation of reactant gases by a low-thermal conductivity inert gas for hot wall vapor phase reactors. As disclosed herein, a heavy, inert gas with low thermal conductivity (such as nitrogen, argon, krypton, xenon, etc.) is flowed through an outer tube such that it surrounds reactant gases flowed through a central port towards a substrate in a hot wall vapor growth reactor. The reactant gases are insulated from the high temperatures of the reactor walls by the heavy outer gas, preventing their decomposition.

Growth in a hydrogen ambient at standard growth temperatures can either lead to arsine decomposition or, if gas velocity is increased to transport the reactants to the surface more quickly, reduce uniformity. Arsine can decompose into arsenic dimers and tetramers in a hot wall growth reactor at standard growth temperatures. However, it is advantageous to transport undecomposed arsine to the surface. High gas velocity can be used to transport arsine to the surface more quickly, in a "hydride-enhanced" growth mechanism. However, a high flow rate can lead to poor growth uniformity across a substrate, which impairs yield. Using an inert gas with low thermal conductivity flowed through an outer tube in order to encapsulate the arsine as it flows to the surface prevents decomposition without requiring exceedingly high reactant velocities or low pressures. A low-conductivity inert gas that blankets the reactant gases also eliminates the flammability risk of having a hydrogen ambient in a hot furnace.

As disclosed herein HVPE has demonstrated a hydride-enhanced regime in which a significant amount of uncracked $AsH_3$ reaches the wafer surface, resulting in much higher growth rates due to the lower kinetic barrier to growth. In both the $As_x$ and the hydride-enhanced regime, the rate-limiting step to GaAs growth is the reduction of GaCl complexes that form on the surface. In the $As_x$ regime, GaCl can be removed either through reduction assisted by the $H_2$ carrier gas to form HCl as a byproduct, or by a slower mechanism where three GaCl are converted to volatile $GaCl_3$. Slower GaAs growth rates were historically observed with an inert carrier gas due to the slower reaction mechanism in the absence of $H_2$. In contrast, the hydride-enhanced regime enables the direct reaction of $AsH_3$ with GaCl to form GaAs without any influence of any carrier gas. The effect of inert carrier gas on growth rate has not been studied in the hydride-enhanced regime.

GaAs Growth Rates of 528 µm/h Using D-HVPE with a Nitrogen Carrier Gas

Disclosed herein are experiments that confirm the observation of lower growth rates in the $As_x$ regime when using $N_2$ as a carrier gas instead of $H_2$, yet reveal a notable increase in growth rate when using $N_2$ in the hydride-enhanced regime. Demonstrated herein are growth rates up to 528 µm/h using $N_2$ carrier gas, compared to 400 µm/h using $H_2$ carrier gas. CFD modeling was used to investigate the effect of carrier gas on internal reactor temperature and relative group V partial pressures to identify potential mechanism for these exceptional growth rates. Using methods disclosed herein, very similar material quality was achieved regardless of the growth regime used.

In an embodiment, materials were grown in a dual-chamber D-HVPE reactor. In an embodiment, a simplified schematic of the reactor can be found in K. L. Schulte, et al., "High growth rate hydride vapor phase epitaxy at low temperature through use of uncracked hydrides," Applied Physics Letters, vol. 112, p. 042101, 2018; and U.S. Pat. No. 9,824,890 by D. L. Young, et al., entitled "High throughput semiconductor deposition system". In an embodiment, GaCl and InCl were formed in-situ by the reaction of anhydrous HCl over elemental Ga and In for the group III sources. Hydride gases were used for the group V source, and n-type doping was achieved using hydrogen selenide ($H_2Se$). The gas plumbing design is such that the carrier gas species is either $H_2$ or $N_2$, but not a combination of both. Changes in the $AsH_3$ carrier flow ($Q_{N_2}^{AsH_3}$ or $Q_{H_2}^{AsH_3}$) were offset by changes to carrier gas flows through other parts of the system to maintain constant partial pressures of all reactant species. The reactor is heated in four independently controlled temperature zones: the two source zones where the metal chlorides are formed were held at 800° C., while the two deposition zones where the substrate is located were both maintained at 650° C. In an embodiment, the substrates used were (100) GaAs substrates miscut 6° towards the (111)A plane. Growth rates were determined by either a contact profilometer to measure the height difference between the GaAs epilayers and a GaInP etch stop, or by cross-sectional scanning electron microscopy (SEM) of a doped GaAs epilayer grown directly on an undoped GaAs substrate. Carrier concentrations and mobilities were determined using van der Pauw Hall-effect measurements, where four contacts were soldered near each corner of a 1 cm×0.5 cm sample using In wire.

The modeling was performed with the commercially available computational fluid dynamics package CFD-ACE+, which allows the user to build and define the geometry in which reactions take place, set initial boundary conditions, and detail the composition and flow of the desired reactants. In an embodiment of the modeling experiments, the temperature was fixed at the reactor walls in the simulation to values of 800° C. at the source zone and 650° C. in the deposition zone, as it is in the real reactor. The effective rate constant for the decomposition of arsine at those temperatures were manually input into CFD-ACE+ from values previously reported in order to take into account $AsH_3$ cracking into $As_4$. The model assumes that any $AsH_3$ that reaches the surface will react with available GaCl to deposit GaAs, an assumption which seems to align well with experimental results. The 3D geometry used for these simulations was a single growth chamber, where carrier gas flows through either a center tube as the carrier for $AsH_3$ or through an inlet that approximates the flows through the actual top port and source boats.

Figure 4:
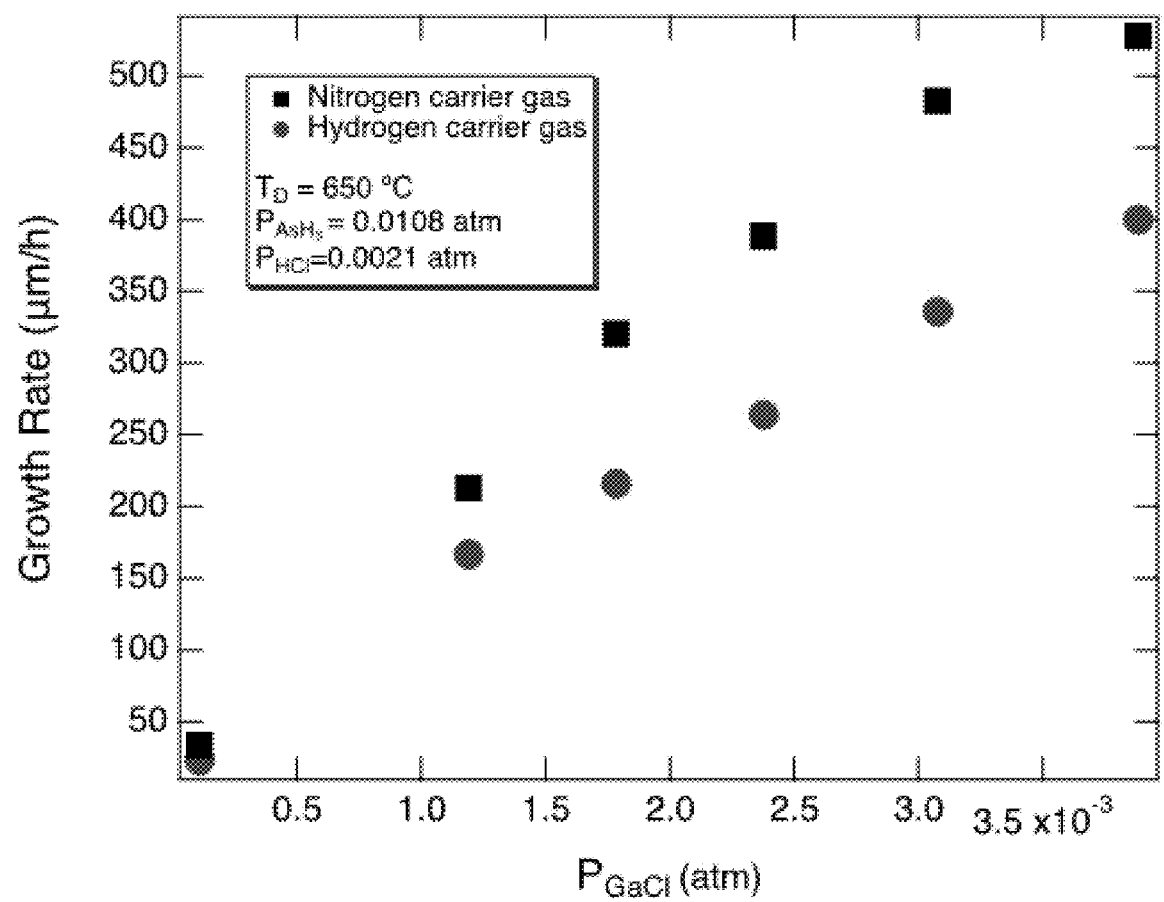
FIG. 4 depicts growth rate as a function of GaCl partial pressure where the AsH$_3$ carrier gas flow in all cases was 5000 sccm. The black squares indicate data using a N$_2$ carrier gas and the red circles indicate data using H$_2$ carrier gas.

It has been demonstrated that a higher $Q_{H_2}^{AsH_3}$ unlocks the hydride-enhanced regime by decreasing the amount of time that $AsH_3$ spends at high temperature as it is injected into the reactor, which minimizes potential decomposition into $As_x$. $AsH_3$ begins to decompose at temperatures above 300° C., and can completely decompose at temperatures exceeding 500° C. Minimizing $AsH_3$ decomposition, therefore, depends strongly on temperature, dwell time, and the surrounding surfaces of the substrate and walls of the reactor. GaAs growth rates were observed with $N_2$ than with $H_2$ while using these hydride-enhanced conditions, in contrast to other work using $As_x$ as the group V source. FIG. 4 shows the GaAs growth rate as a function of GaCl partial pressure ($P_{GaCl}$) for both types of carrier gas, using conditions that are not limited by the availability of $AsH_3$. The growth rates using both $H_2$ and $N_2$ carriers linearly increase with increasing GaCl partial pressure until the highest $P_{GaCl}$ tested, resulting in GaAs growth rates up to 528 µm/h using $N_2$ carrier gas and 400 µm/h using $H_2$ carrier gas and otherwise using the equivalent growth conditions, listed in FIG. 4.

Figure 5:
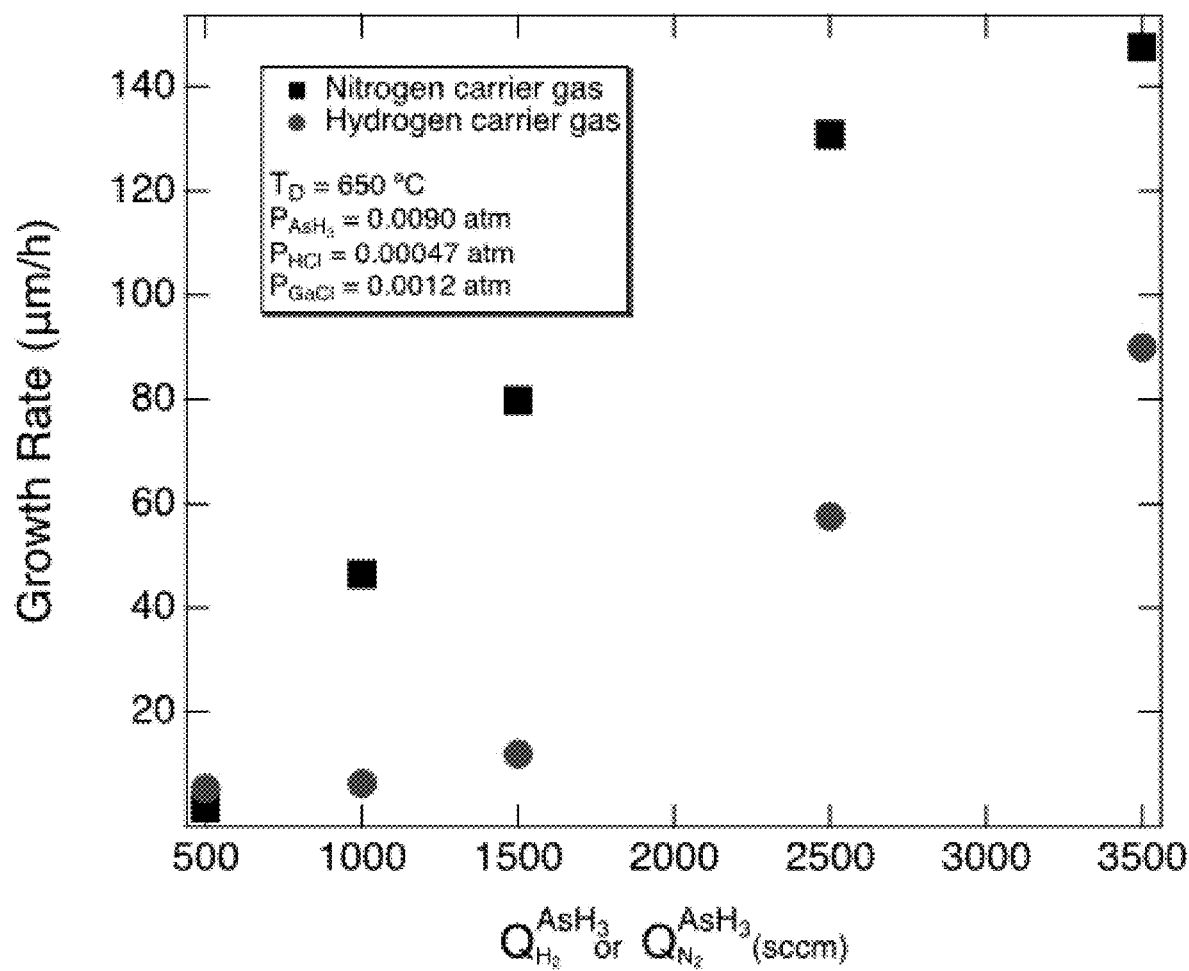
FIG. 5 depicts GaAs growth rate vs. AsH$_3$ carrier gas flow for either H$_2$ or N$_2$ carrier gas.

The data shown in FIG. 4 are at the mass-flow controller maximum of 5000 standard cubic centimeters per minute ("sccm") for either $Q_{N_2}^{AsH_3}$ or $Q_{H_2}^{AsH_3}$. It has been previously shown that maintaining a high $AsH_3$ carrier gas flow is critical to unlocking high growth rates since the high resultant gas velocity minimizes cracking of $AsH_3$ into $As_x$ species in our reactor. FIG. 5 shows how changing $Q_{N_2}^{AsH_3}$ and $Q_{H_2}^{AsH_3}$ affects the growth rate. In this experiment, increased $Q_{N_2}^{AsH_3}$ and $Q_{H_2}^{AsH_3}$ was offset by decreased carrier gas flow of an equal amount through other parts of the system to maintain constant reactant dilution for each data point. It was discovered that at a relatively low 500 sccm for $Q_{N_2}^{AsH_3}$ and $Q_{H_2}^{AsH_3}$, which is correlated with greater $AsH_3$ decomposition, the growth rate with $N_2$ is lower than $H_2$ (1.68 µm/h compared to 5.4 µm/h), which is a similar percent decrease in growth rate reported for inert carrier gas at 650° C. However, as either $Q_{N_2}^{AsH_3}$ or $Q_{H_2}^{AsH_3}$ is increased, the growth rate of the samples grown with $N_2$ becomes significantly higher than those grown with $H_2$. This result implies that the extent of $AsH_3$ cracking between GaAs growth using $H_2$ or $N_2$ is different.

Figure 2:
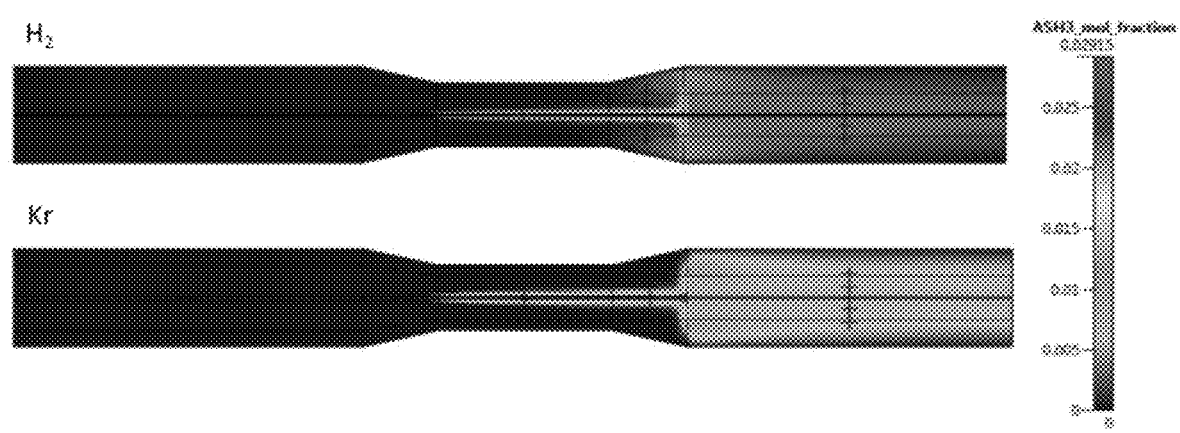
FIG. 2 depicts an embodiment of a portion of a HVPE reactor that uses a low-thermal conductivity inert gas.
Figure 3:
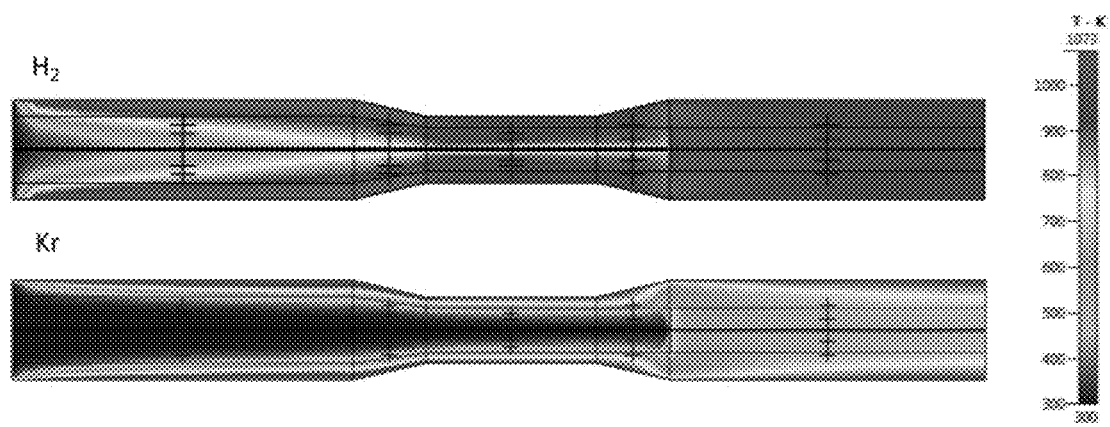
FIG. 3 depicts an embodiment of a portion of an HVPE reactor that uses a low-thermal conductivity inert gas. As depicted in FIG. 3 the temperature is significantly lower at a reaction surface of the HVPE reactor when using a low-thermal conductivity inert gas when compared to using hydrogen.
Figure 6:
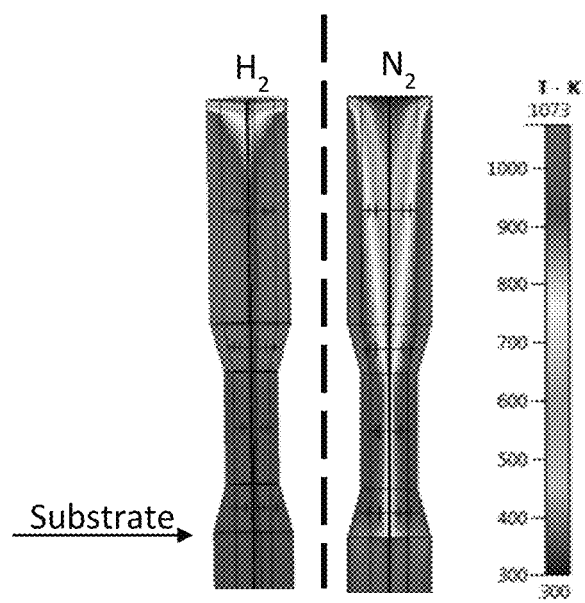
FIG. 6 depicts computational fluid dynamics (CFD) modeling of the temperature distribution of the growth chamber using H$_2$ (left) and N$_2$ (right), where the lower thermal conductivity gas insulates the AsH$_3$ carrier gas flow in the center from the hot reactor walls, thus keeping the AsH$_3$ at a lower temperature and minimizing the likelihood of thermal decomposition.

CFD modeling was also used to better understand the influence of the carrier gas on the extent of $AsH_3$ decomposition. In these simulations, carrier gas flows through either a center tube to simulate $Q_{N_2}^{AsH_3}$ and $Q_{H_2}^{AsH_3}$ or through a top inlet that approximates the flows through the rest of our reactor. The flow rates through the top inlet in CFD-ACE+ are 7500 sccm for the carrier gas and 10 sccm for GaCl, while the flows through the center tube were 65 sccm for $AsH_3$ and 2500 sccm for the carrier gas. These flows correspond to the actual flows used for the data points in FIG. 2 at 2500 sccm for $Q_{N_2}^{AsH_3}$ and $Q_{H_2}^{AsH_3}$ FIG. 6 depicts the modeled temperature distribution inside the growth chamber for either $H_2$ or $N_2$. In the $H_2$ case, the internal reactor temperature uniformly approaches the reactor wall boundary conditions of 800° C. in the source zone and 650° C. in the deposition zone, except for the lower temperature near the top inlet of the simulation. In the $N_2$ case, the temperature towards the center of the reactor is much lower than that of the walls. The thermal conductivity at 650° C. is 0.423 W/m·K for $H_2$, compared to 0.0612 W/m·K for $N_2$. The model shows that the nearly 10× lower thermal conductivity of $N_2$ greatly reduces heat transfer from the hot reactor walls. This effect decreases the temperature of the $AsH_3$ that flows through the center of the reactor, subsequently decreasing the likelihood of thermal decomposition.

Figures 7A, 7B, 7C:
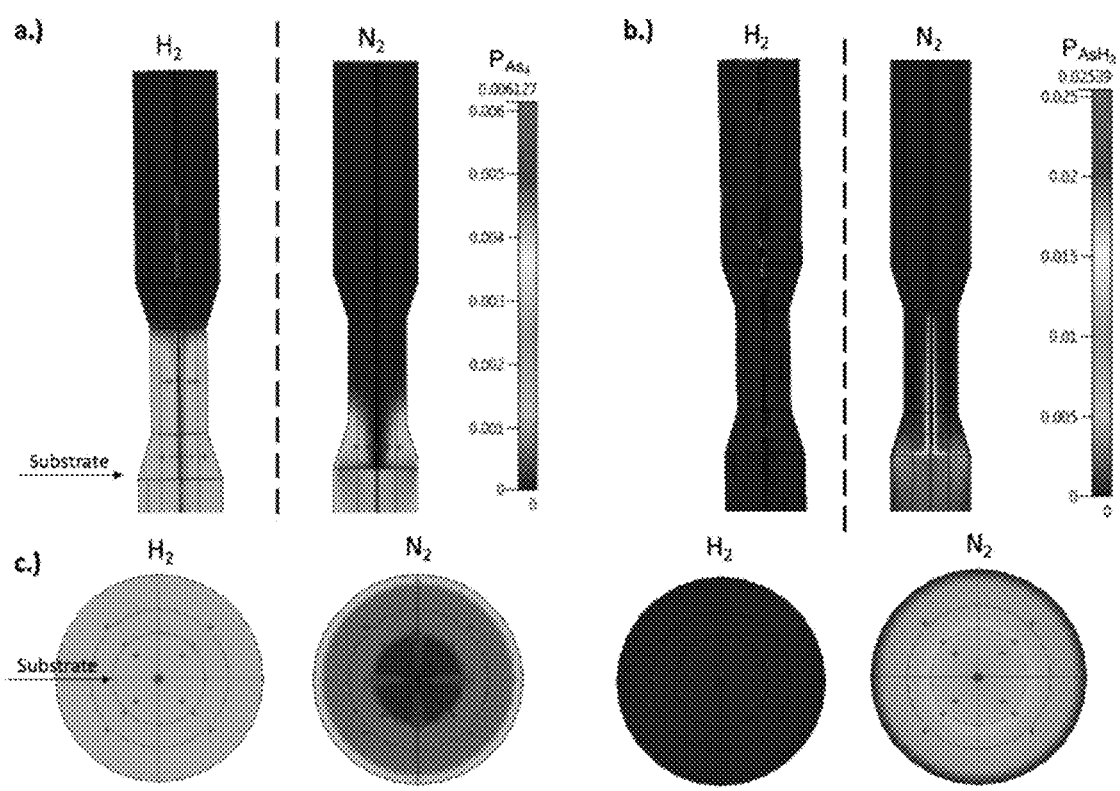
FIGS. 7a, 7b and 7c depict CFD modeling of As$_4$ partial pressure inside the growth chamber.

FIG. 7 depicts the partial pressures of $As_4$ and $AsH_3$ both as the species evolve down the length of the reaction chamber and as they appear at the plane of the substrate. The kinetic constants for the decomposition of $AsH_3$ at the temperature of the two heater zones in these simulations were previously reported. FIG. 7a shows the $As_4$ partial pressure for $N_2$ and $H_2$ carrier gas as it evolves through the reactor. A greater partial pressure of $As_4$ can be observed in the $H_2$ case, without being bound by theory, this is likely due to the higher temperature due to the higher thermal conductivity carrier gas as depicted in FIG. 6, and correspondingly increased likelihood for $AsH_3$ to decompose into $As_4$. FIG. 7b depicts a correspondingly low $AsH_3$ partial pressure due to thermal decomposition, where the amount of both species at the substrate is shown in FIG. 7c. In the $N_2$ case, $AsH_3$ only begins to decompose near the tapering of the reactor walls, while a significant amount of $AsH_3$ still reaches the substrate in the simulation, and a much lower partial pressure of $As_4$ is observed. The $AsH_3$ partial pressure is about 0.01 atm for $N_2$ carrier gas, which is close to the $AsH_3$ partial pressure used experimentally in FIGS. 4 and 5. These results indicate that the low thermal conductivity of $N_2$ is able to thermally insulate $AsH_3$ from the hot reactor walls and minimize thermal decomposition compared to $H_2$, which is consistent with the higher growth rates with $N_2$ disclosed herein.

FIGS. 6 and 7 together show that the temperature of the center of the reactor where $AsH_3$ is transported is lower with $N_2$, allowing comparatively more $AsH_3$ to reach the wafer surface. In the hydride-enhanced regime, the mechanism for GaAs growth is

$$GaCl + AsH_3 \leftrightarrows GaAs + HCl + H_2 \qquad (1)$$

and the growth rate increases with enhanced preservation of $AsH_3$. Without being bound by theory, because GaAs has a lower kinetic barrier to growth under $AsH_3$ than $As_x$, and less $AsH_3$ decomposition occurs with the low thermal conductivity carrier gas, the resulting growth rate is higher for $N_2$ compared to $H_2$.

For low $Q_{N_2}^{AsH_3}$, significant $AsH_3$ decomposition into $As_x$ occurs. In this case, $As_x$ is the predominant group V reactant, and

$$GaCl + \tfrac{1}{4} As_4 + \tfrac{1}{2} H_2 \leftrightarrows GaAs + HCl \qquad (2)$$

is the reaction attributed to GaAs growth. In this case, $H_2$ participates as a reactant and enables higher growth rates compared to GaAs growth with $N_2$. This explains both the decrease in growth rate observed in FIG. 5 for decreasing $Q_{N_2}^{AsH_3}$, as well as the crossing of the growth rate trends at the lowest $Q_{N_2}^{AsH_3}$. Without the presence of $H_2$, the growth likely proceeds according to

$$3GaCl + \tfrac{1}{4} As_4 \leftrightarrows 2GaAs + GaCl_3 \qquad (3)$$

where the carrier gas plays no direct role in the reaction. For disproportionately large amounts of group III precursors, this reaction mechanism can yield higher GaAs growth rates compared to $H_2$. However, for the GaCl partial pressure of 0.0012 atm used in these experiments, it is statistically improbable to assemble 3 GaCl molecules to create $GaCl_3$, leading to the observed lower growth rate with $N_2$ due to these kinetic limitations. Together, FIGS. 6 and 7 indicate that the lower thermal conductivity of $N_2$ is responsible for the lower temperature in the center of the reactor, as well as the increased growth rates.

The average surface roughness, electron mobility, electron concentration of the samples in FIG. 4 were measured to verify the material for GaAs grown with either $H_2$ and $N_2$ carrier gas for a range of growth rates, displayed in Table 1. These samples were n-type GaAs grown on a nominally undoped GaAs substrate in order to ensure that any roughness could be directly attributed to the GaAs growth. The average roughness for these samples, calculated from a 1 μm×1 μm AFM scan, reveals that the average surface roughness stays below 0.8 nm with no attempt to optimize the growth conditions—such as V/III ratio. At the highest $P_{GaCl}$ tested, samples began to substantially roughen for both $H_2$ and $N_2$. Without being bound by theory, it is suspected that this is due to the decreasing V/III ratio as the $P_{GaCl}$ increases and the $AsH_3$ flow remains constant at the mass-flow controller maximum. It is likely that the surface morphology would return to smooth if more group V precursor were available. It is also expected that these growth rates would continue to increase if the $AsH_3$ did not become limiting, but these data represent the maximum growth rates we can achieve given our current mass-flow controller for $AsH_3$ and $AsH_3$ carrier flow, which precludes our ability to adjust V/III ratio as we further increase GaCl.

The electron mobility and concentration were determined using Hall-effect measurements of GaAs epilayers grown with the same $H_2Se$ flow between samples. The electron mobilities are high at all growth rates using $H_2$ carrier gas, and only begin to degrade by 300 $cm^2$/V-s between 483 μm/h and 389 μm/h with $N_2$ carrier gas. Additionally, the value of electron mobilities are reasonably close between $H_2$ and $N_2$ carrier gas, which is a promising result for device quality at high growth rates with $N_2$ since excellent device performance has been realized with $H_2$.

TABLE 1

Average surface roughness, electron mobility, and electron concentration for the samples in FIG. 4 for a range of growth rates using $N_2$ or $H_2$ carrier gas.

| Growth rate (μm/h) | Carrier gas | Average roughness (nm) | Mobility ($10^3$ $cm^2$/V-s) | Electron concentration ($10^{18}$ $cm^{-3}$) |
|---|---|---|---|---|
| 33 | $N_2$ | 0.35 | 1.6 | 2.1 |
| 213 | $N_2$ | 0.26 | 1.0 | 9.9 |
| 320 | $N_2$ | 0.36 | 1.2 | 7.6 |
| 389 | $N_2$ | 0.30 | 1.2 | 7.0 |
| 483 | $N_2$ | 0.38 | 0.9 | 4.5 |
| 528 | $N_2$ | | In progress | |
| 23 | $H_2$ | 0.78 | 1.4 | 2.5 |
| 167 | $H_2$ | 0.36 | 1.0 | 5.3 |
| 216 | $H_2$ | 0.29 | 1.1 | 7.4 |
| 264 | $H_2$ | 0.26 | 1.2 | 6.8 |
| 336 | $H_2$ | 0.37 | 1.3 | 4.7 |
| 400 | $H_2$ | | In progress | |

Using methods and devices disclosed herein, record growth rates up to 400 µm/h using $H_2$ and 528 µm/h using $N_2$ in a D-HVPE reactor have been demonstrated, with smooth surfaces and high electron mobility demonstrated up to growth rates of 336 µm/h and 483 µm/h for the respective carrier gases. The high throughput, lower cost, and safety benefits of the $N_2$ compared to the incumbent $H_2$ used in III-V As/P HVPE systems make $N_2$ an attractive alternative for carrier gas. CFD modeling showed that enhanced $AsH_3$ delivery to the wafer surface enabled by a lower internal reactor temperature using a $N_2$, whereas more $As_x$ reaches the wafer surface with $H_2$. However, for low $AsH_3$ carrier gas flows, significant $AsH_3$ decomposition occurs, and $As_x$ becomes the predominant group V reactant. In this case, $H_2$ plays an enabling role in the growth mechanism, and subsequently a higher growth rate is observed with $H_2$ instead of $N_2$. This result indicates that it is possible to grow GaAs at high growth rates under a $N_2$ environment which should reduce deposition cost by eliminating expenses associated with producing and handling $H_2$ in a high temperature environment.

We claim:

1. A method for growing at least one layer of a semiconductor device using a reactor comprising at least one source zone and at least one deposition zone wherein the method comprises hydride vapor phase epitaxy (HVPE) using at least one group III metal, at least one group V hydride gas, and an inert carrier gas; wherein the growth rate of the at least one layer of a semiconductor device is improved by up to 32 percent when compared to using $H_2$ as a carrier gas in the reactor instead of the inert gas.

2. The method of claim 1 wherein the at least one source zone is at a temperature of up to about 800° C., and wherein the at least one deposition zone is at a temperature of up to about 700° C.

3. The method of claim 1 wherein the at least one layer of the semiconductor device is GaAs.

4. The method of claim 3 wherein the GaAs growth rate is up to 528 µm/h.

5. The method of claim 1 wherein a volumetric flow rate of the inert carrier gas and group V hydride gas is up to 5000 sccm.

6. The method of claim 1 wherein a volumetric flow rate for the group V hydride gas is up to 100 sccm.

7. The method of claim 1 wherein a partial pressure for the group V hydride gas within the inert carrier gas is up to 0.01 atm.

8. The method of claim 3 wherein a surface roughness of the GaAs layer is below 0.8 nm.

9. The method of claim 3 wherein an electron mobility of the GaAs layer is up to 1600 $cm^2$/V-s.

10. The method of claim 3 wherein an electron concentration of the GaAs layer is up to $9.9\times10^{18}$ $cm^{-3}$.

11. The method of claim 1, wherein the inert carrier gas comprises $N_2$ or Ar.

* * * * *